United States Patent [19]

Class et al.

[11] Patent Number: 4,525,262

[45] Date of Patent: Jun. 25, 1985

[54] MAGNETRON REACTIVE BIAS SPUTTERING METHOD AND APPARATUS

[75] Inventors: Walter H. Class, Yonkers, N.Y.; Steven D. Hurwitt, Park Ridge, N.J.; Michael L. Hill, New York, N.Y.

[73] Assignee: Materials Research Corporation, Orangeburg, N.Y.

[21] Appl. No.: 555,449

[22] Filed: Nov. 28, 1983

Related U.S. Application Data

[63] Continuation of Ser. No. 342,977, Jan. 26, 1982, abandoned.

[51] Int. Cl.$^3$ .............................................. C23C 15/00
[52] U.S. Cl. ................................. 204/192 R; 204/298; 204/192 N
[58] Field of Search ................. 204/192 R, 192 N, 298

[56] References Cited

U.S. PATENT DOCUMENTS

| | | | |
|---|---|---|---|
| 2,146,025 | 2/1939 | Penning | 204/192 R |
| 3,303,116 | 2/1967 | Maissel et al. | 204/192 |
| 3,399,129 | 8/1968 | Flur et al. | 204/192 |
| 3,869,368 | 3/1975 | Beardmore et al. | 204/192 |
| 3,884,793 | 5/1975 | Penfold et al. | 204/298 |
| 4,041,353 | 8/1977 | Penfold et al. | 315/267 |
| 4,046,660 | 9/1977 | Fraser | 204/192 C |
| 4,116,791 | 9/1978 | Zega | 204/192 N |
| 4,126,530 | 11/1978 | Thornton | 204/192 EC |
| 4,194,962 | 3/1980 | Chambers et al. | 204/298 |
| 4,221,652 | 9/1980 | Kuriyama | 204/298 |
| 4,298,443 | 11/1981 | Maydan | 204/192 E |

FOREIGN PATENT DOCUMENTS

| | | | |
|---|---|---|---|
| 0027553 | 9/1980 | European Pat. Off. | 39/ |
| 55-91975 | 7/1980 | Japan | 204/192 SP |
| 1358411 | 7/1974 | United Kingdom | 204/192 R |

OTHER PUBLICATIONS

O. Christensen: "Characteristics and Applications of Bias Sputtering," Solid State Technology, vol. 13, No. 12, Dec. 1970, pp. 39-45.
John A. Thornton and Alan S. Penfold: "Cylindrical Magnetron Sputtering", (Chapter II-2, Thin Film Processes, J. L. Vossen & W. Kern, eds., Academic Press, 1978).

*Primary Examiner*—Aaron Weisstuch
*Attorney, Agent, or Firm*—Kenyon & Kenyon

[57] ABSTRACT

The film deposition rate of metallic compounds onto a substrate in a vacuum chamber by reactive sputtering or reactive ion plating is significantly increased by providing a substrate support with spaced apart magnetic poles to create a magnetic field having lines of force which leave the support, extend across a surface of the substrate exposed to a metallic coating source and re-enter the support to enclose the exposed surface in a localized magnetic electron-trapping field. A reactive gas is fed into the chamber, and a bias voltage is applied to the substrate support sufficient to create a dense glow discharge of ionized reactive gas closely adjacent to the substrate surface. The reactive gas ions react with metallic particles deposited on the exposed substrate surface from the coating source to form a film of the desired metallic compound. The localized magnetic plasma trap close to the substrate increases the chemical reaction rate at the substrate and reduces back sputtering, to result in a metallic compound coating having superior physical and chemical characteristics.

18 Claims, 5 Drawing Figures

MAGNETRON REACTIVE BIAS SPUTTERING METHOD AND APPARATUS

This application is a continuation of application Ser. No. 06/342,977, filed 26 Jan. 1982, abandoned.

BACKGROUND OF THE INVENTION (1) Field of the Invention

The present invention relates to sputtering methods and apparatus, and particularly to methods and apparatus for bias sputtering.

(2) Description of the Prior Art

Sputter coating is a well-known technique for coating a substrate with material eroded from the cathode of a low pressure gas electrical discharge (glow discharge) created between a cathode and an anode maintained at a suitable voltage difference in a low pressure gas atmosphere. A glow discharge contains an abundance of positively charged ions formed by collision of electrons with atoms of the low pressure gas. The resulting ions are attracted to the negatively charged cathode, which they impact with considerable energy. This ion impact dislodges cathode surface atoms which will then condense on, and thereby coat, the surface of any object placed near the cathode.

Since sputtering is a low pressure process, it must be carried out in a hermetically sealed chamber, which is first evacuated and then back-filled with a suitable sputtering gas, usually argon, and maintained at the proper sputtering pressure, typically 5 to 40 millitorr.

In many coating applications the substrate to be coated is placed on the anode of the gas discharge, since the anode is usually directly opposite the cathode, in a suitable location for coating by dislodged cathode atoms. Most sputtering systems use an anode at ground potential and apply a large negative voltage to the cathode; the grounded sputtering chamber then becomes an auxiliary anode.

Bias sputtering is a modified sputter coating technique in which a bias potential, usually negative, is applied to the substrate which is to be coated. This bias potential causes some of the gas discharge ions to be attracted to the substrate during the deposition process. The ion impact can produce desirable changes in the nature of the sputter coating. An important use of the bias sputtering technique is in the so-called reactive sputtering process. During active sputtering, a chemically active gas, such as oxygen or nitrogen, is added to or substituted for the usual inert sputtering gas (e.g., argon). Reactive species of such active gas are created in the glow discharge region, along with the usual argon ions, and these species react with sputtered target atoms deposited on the substrate to form a desired compound. The reactive sputtering technique thus permits sputtering from a pure metal target, aluminum for example, to produce a compound coating on the substrate (e.g., aluminum oxide or aluminum nitride). Reactive sputtering has economic advantages because the sputtering rate from a metal target is much higher than from a target composed of the metallic compound.

Bias sputtering, by placing a negative potential on the substrate, increases the chemical reaction rate by, among other things, attracting the positively charged reactive gas species or ions. Substrate biasing has a limitation, however, because ion bombardment can also cause undesirable substrate heating and gas ion implantation in the coating. Thus, the problem is to obtain a large flux of low-energy ions (energy levels of 20 to 100 electron-volts) which are sufficient for the chemical reaction process at the substrate surface, without getting a significant amount of high-energy ion bombardment.

More complete descriptions of prior art sputter techniques, including reactive sputtering and bias sputtering, may be found in "Gas Discharge Processes", by B. M. Chapman (J. Wiley & Sons, 1980) and "Thin Film Processes", edited by J. L. Vossen and W. Kern (Academic Press, Inc., 1978). One way known to the prior art for increasing ionization in a gas discharge is by use of magnetic field traps. Such magnetically enhanced sputtering was first developed by Penning, as disclosed in U.S. Pat. No. 2,146,025. Variations of the Penning structures have been used to achieve efficient high-rate sputtering cathodes (U.S. Pat. Nos. 3,282,815; 3,282,816; 3,325,394; 3,369,991; 3,711,398; 3,878,085; 3,995,187; 4,030,996; 4,031,424; 4,041,353; 4,111,782; 4,116,793; 4,166,018; 4,194,062; 4,198,283). In addition, the above-cited Vossen text shows at page 32 a radio-frequency (rf) powered bias sputtering apparatus having both cathode and anode magnets for generating a magnetic field between the cathode and the substrate supporting bias electrode. These magnets are incapable of creating a re-entrant field magnetic electron trap enclosing the substrate support surface, however. Such closed-loop fields have been use only in connection with high-rate sputtering sources (i.e., cathodes).

SUMMARY OF THE INVENTION

The primary object of the present invention is to provide a bias sputtering method and apparatus which increases the flux of ions and reactive radicals delivered to a biased substrate, without increasing substrate heating or ion implantation, relative to prior art bias sputtering methods and arrangements.

It is a further object of the invention to provide a method and apparatus for reactive bias sputtering which assures completion of a desired sputter coating reaction at a substrate surface without a significant corresponding reaction occurring at the source.

These and other objects are achieved by a method of bias sputtering which includes the steps of positioning a coating source and a substrate support in a hermetic chamber, placing at least one substrate on said substrate support so that a surface of the substrate is exposed to the coating source, evacuating the chamber, introducing at least one gas into the chamber, activating said coating source, and applying a bias voltage to the substrate support, wherein the improvement comprises:

providing a magnetic field having lines of force which leave the support, extend across the surface of the substrate exposed to the coating source, and re-enter the support to enclose said exposed surface in a magnetic electron-trapping field and adjusting the bias voltage to produce a dense glow discharge closely adjacent to said substrate surface.

The method further comprises placing a plurality of substrates in spaced relation on a continuous surface of a biased substrate support and depositing particles from the coating source upon each substrate sequentially while continuously maintaining the dense glow discharge closely adjacent to the exposed surfaces of all the substrates.

The invention also comprises apparatus for performing the above method, and particularly including an evacuable chamber, means for evacuating the chamber, means for introducing at least one gas at low pressure into the chamber, a coating source located in the chamber, a bias electrode in the chamber having at least one substrate support surface electrically insulated from the chamber and exposed to the coating source, means for activating the coating source to emit particles of a coating material, and means for applying a bias voltage to the substrate support surface, wherein the improvement comprises:

means for providing a magnetic field having lines of force which leave said bias electrode, extend across the substrate support surface between said support surface and the coating means, and re-enter said bias electrode to completely enclose said substrate support surface in a magnetic electron-trapping field.

In a preferred embodiment, the bias electrode comprises a prismatic body having a plurality of flat faces surrounding an axis of symmetry, said faces comprising at least one substrate support surface, and means for supporting the prismatic body for rotation about it axis of symmetry, and the means for providing said magnetic field comprises first and second spaced apart magnetic pole means of opposite polarity, each pole means projecting outwardly from the faces of and extending completely around the prismatic body, and the substrate support surfaces being located between the first and second pole means, whereby the magnetic field forms a continuous belt around the body of the bias electrode between the first and second pole means, and the coating source comprises a stationary sputtering target positioned on a line perpendicular to the axis of symmetry of the bias electrode, and said apparatus further comprises means for rotating the bias electrode so that each substrate support surface will move past the sputtering target.

The above and other objects and features of the invention, as well as its advantages over the prior art, will be more apparent from the following detailed description in connection with the accompanying drawings.

DETAILED DESCRIPTION OF THE PREFERRED EMBODIMENTS

Figure 1:
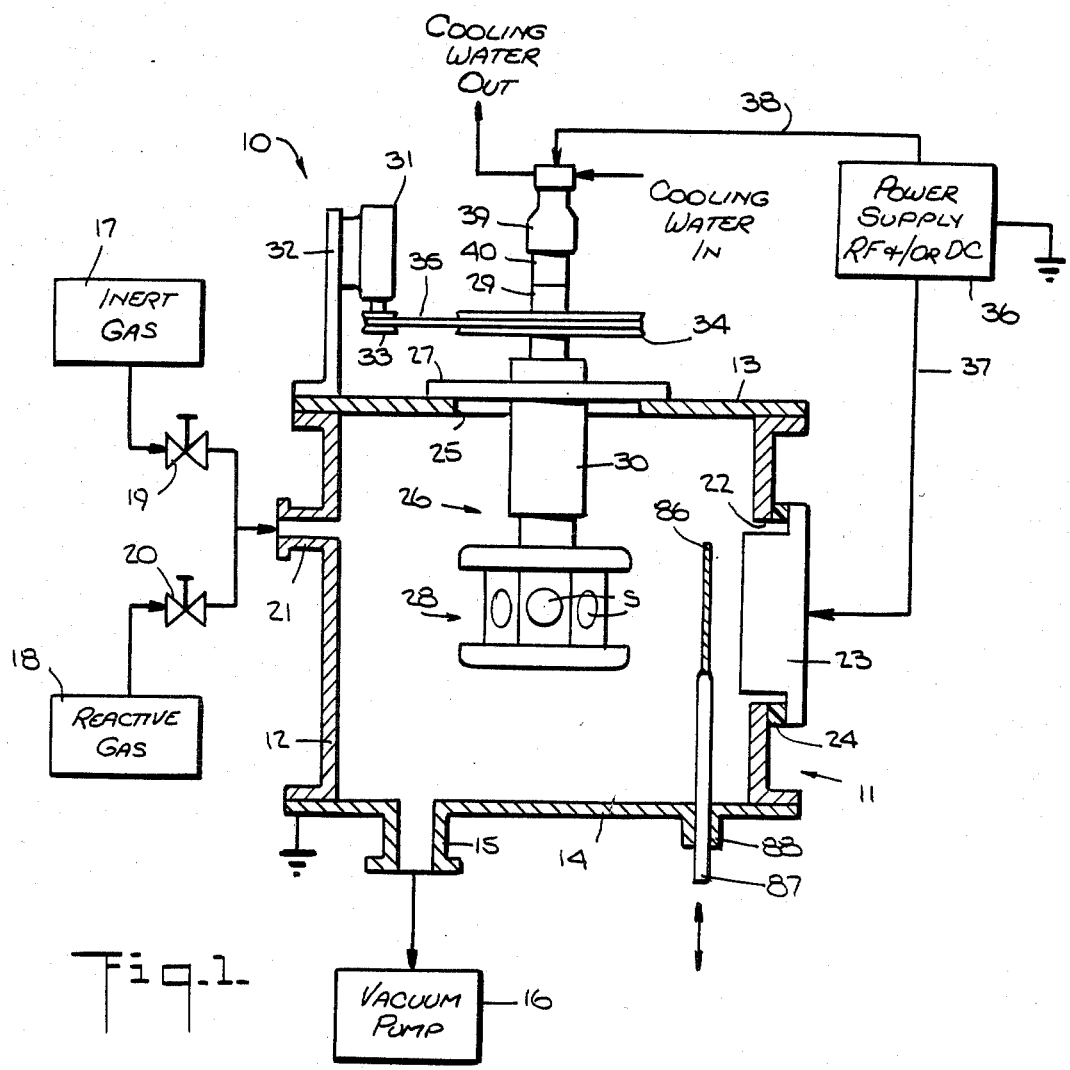
FIG. 1 is an elevation semi-schematic view in partial cross section of a sputtering apparatus including a substrate support structure according to the present invention.

FIG. 1 illustrates in semi-schematic form a bias sputtering apparatus 10 incorporating one embodiment of a substrate support structure according to the present invention and operable in accordance with the method of the invention. The apparatus includes a hermetic chamber 11 having an open-ended shell 12 closed by a top sealing plate 13 and a bottom sealing plate 14. For simplicity, conventional clamping means, such as bolts and nuts, and conventional seals, such as O-ring seals, which are needed to provide the necessary vacuum-tightness of the chamber assembly, are not shown.

A pump-out opening 15 in the bottom plate leads to a vacuum pump 16. An inert gas, such as argon, and a reactant gas, such as oxygen or nitrogen, may be selectively introduced into the chamber from respective sources 17 and 18 through respective valves 19 and 20 and inlet 21.

An opening 22 in the chamber shell side wall permits mounting a coating material source, such as a sputtering source 23, by means of a standoff insulator ring 24 and appropriate fastening and sealing means (not shown) in a conventional manner. The sputtering source can be of conventional construction, including a target of material desired to be sputter coated onto substrates, and associated supporting and cooling structure, dark-space shields, and so forth. Through another opening 25 in the top plate of the chamber, a bias electrode substrate support assembly 26 extends into the chamber and is sealingly attached to the top plate 13 by a mounting plate 27 and suitable fasteners and seals (not shown).

The construction of the bias electrode substrate support assembly will be described in detail with reference to FIG. 2, but, briefly, it includes a prismatic spool-shaped electrode 28 (of hexagonal cross section in the illustrated embodiment) suspended by a tubular shaft member 30 welded or otherwise attached to mounting plate 27. A drive motor 31 mounted on a bracket 32 which is fastened to the top sealing plate 13 is coupled to the shaft 29, as by means of sheaves 33 and 34 and V-belt 35, for selectively indexing or continuously rotating the bias electrode 28 about a vertical axis. Alternatively, the motor can be coupled to shaft 29 by gears or any other suitable and conventional means.

Each face of the hexagonal bias electrode has provision for mounting a substrate s, such as a conventional ceramic disc or wafer used in the manufacture of integrated circuits and rotation of the bias electrode by drive motor 31, either intermittently or continuously, permits either each substrate to be indexed in turn to face the sputtering source 23 or the substrates to receive incremental depositions as the electrode rotates continuously like a spit. Radio frequency (rf) and/or direct current (dc) power is supplied from a power supply 36 via line 37 to the sputtering source 23 and via line 38 to a coupling 39 mounted on the upper end of tubular shaft 29 by an insulator 40. The power supply can be of any commercially available type used in conventional bias sputtering systems. Coupling 39 also is equipped with inlet and outlet connections for permitting a flow of cooling water to the interior of bias electrode 28.

Figure 2:
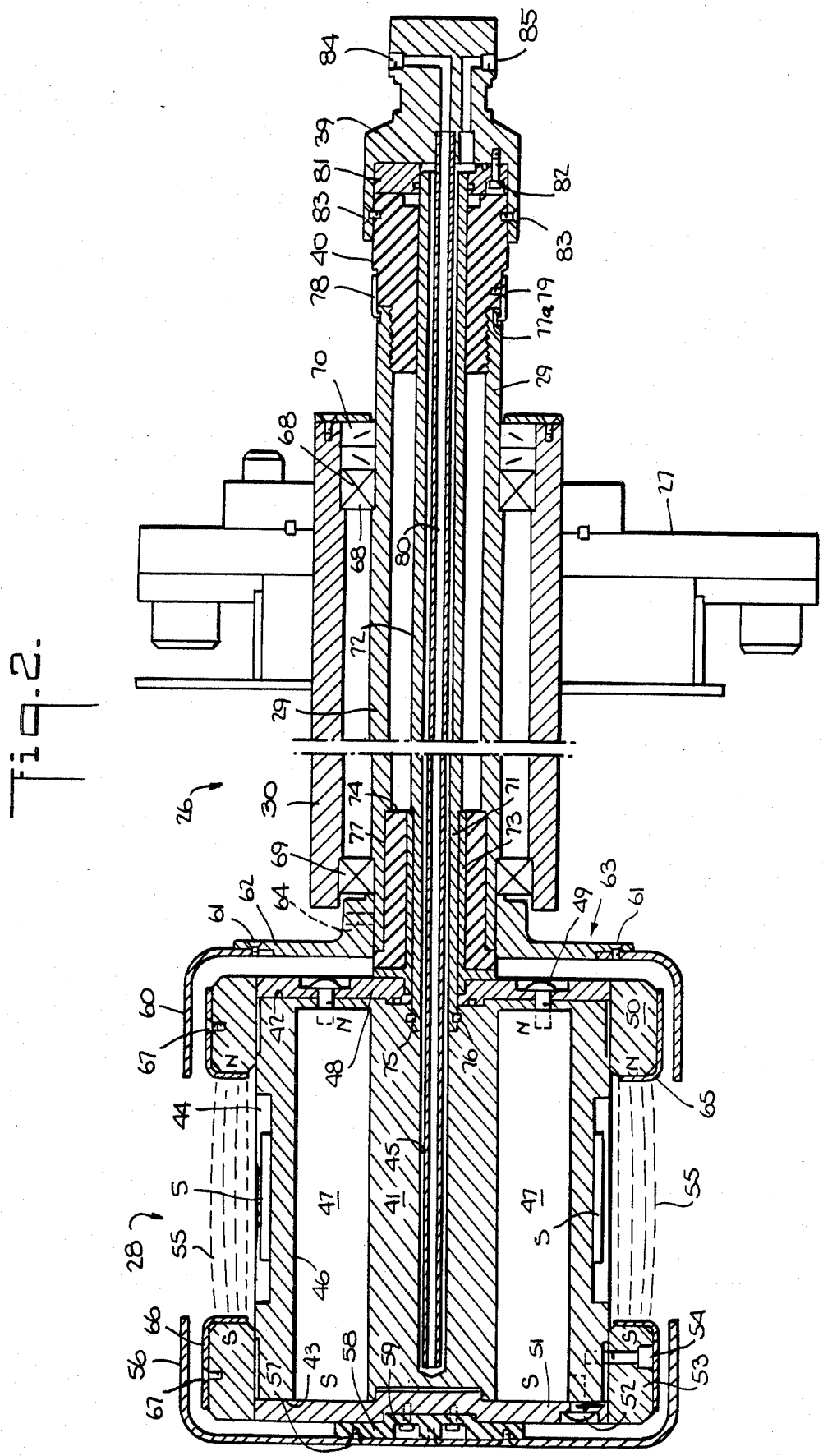
FIG. 2 is a side view in cross section of the substrate support structure of FIG. 1.

With reference to FIG. 2, the bias electrode substrate support assembly 26 comprises basically the prismatic bias electrode 28 and associated suporting structure for suspending the bias electrode from mounting plate 27 so that the electrode can be rotated about its axis and so that electric power and fluid coolant can be delivered to it.

Electrode 28 is an assembly comprising a prismatic block 41 of electrically conductive nonmagnetic material, such as copper or aluminum, and having an upper end 42 and lower end 43. As previously described, the block has a polygonal cross section, which in the embodiment illustrated in FIG. 1 is hexagonal but may be of any desired number of sides, each side forming one of the faces of the electrode. Each face of the prismatic block 41 has a shallow circular depression 44 provided with suitable conventional clamping means (not shown) for holding a substrate disc s. Block 41 also has a central well hole 45 drilled coaxially from its upper end 42 and a number of angularly spaced pockets 46 extending from its lower end parallel to the axis of the block, each pocket being sized to slidingly hold a bar magnet 47.

A flat hexagonal pole piece 48 fastened to the upper end of each bar magnet by screws 49 provides a magnetic path to a pole piece 50 in the form of a hexagonal band surrounding the upper end of electrode block 41, the pole piece 48, screws 49, and pole piece 50 all being made of soft iron and other magnetically permeable material. A similar magnetic path is provided by a flat hexagonal pole piece 51 which is fastened onto the lower end 43 of electrode block 41 by screws 52 so as to contact both the lower end of each bar magnet and also the inner surface of a pole piece 53, identical to pole piece 50 and surrounding the lower end of electrode block 41. Pole pieces 51 and 53 are also made of magnetically permeable material.

The resulting bias electrode assembly thus has the shape of a prismatic spool, with pole pieces 50 and 53 being fastened to electrode block 41 by machine screws 54.

All of the bar magnets are oriented in the same direction, it being immaterial, however, whether the north-seeking poles are adjacent the upper end of the electrode block, as shown, or adjacent the lower end. The pole pieces extend the magnetic structure so that the upper flange of the spool-shaped electrode assembly forms a single magnetic pole (e.g., north in the illustrated embodiment), and the lower flange forms an opposite magnetic pole, each pole extending in a band around the respective end of the prismatic electrode block.

Magnetic lines of force, indicated by dashed lines 55, extend across the air gap between these poles and surround the electrode faces like an annular curtain or belt to form, in combination with the electrode structure, an enclosed electron trap immediately adjacent to the exposed surfaces of the substrates. The strength of this magnetic field is preferably in the range of about 50 to about 1,000 gauss.

As will be described in further detail below, in connection with FIG. 3 and the operation of the apparatus of the invention, when power is applied to the electrode, a dense glow discharge or plasma is created in this electron trap. To prevent his discharge from extending to the adjacent surfaces of the bias electrode assembly, a cup-shaped lower dark space shield 56 is attached by screws 57 to an insulator 58, which in turn is fastened to the pole piece 51 by screws 59. A corresponding umbrella-shaped upper dark-space shield 60 is attached by screws 61 to a flange 62 of a collar 63, which itself is mounted on the lower end of the previously described rotatable tubular shaft 29 by means of screws 64. In addition, to prevent contamination of the film applied to substrates s, annular pole piece lids 65 and 66 are fastened to the exposed surfaces of pole pieces 50 and 53, respectively, by screws 67, the material of the lids being preferably either the same as that of the target of the sputtering source 23 or else inert to the reactive species in the glow discharge.

As previously mentioned, tubular shaft 29 is coaxially mounted for rotation within stationary tubular member 30, the mounting being accomplished by means of an upper bearing 68 and a lower bearing 69. In addition, a rotary vacuum seal 70 of conventional design is installed at the upper end of the stationary tubular member 30 between the inner surface of the member and the outer surface of rotatable shaft 29.

Before the tubular shaft 29 is assembled inside stationary tube 30, a relieved lower end portion 71 of a coolant return tube 72 is inserted, through a flanged support socket 73 which is welded or otherwise attached to pole piece 48 and carries an insulating sleeve 74, into a counterbore 75 at the upper end of the well hole 45 in the electrode block 41. The counterbore 75 is provided with an annular groove 76 for an O-ring (not shown) or other means for assuring a vacuum-tight seal between the electrode block and tube 72, while at the same time permitting tube 72 to be slidably disassembled from the electrode assembly. Coolant return tube 72 is then inserted into tubular shaft 29 until the insulating sleeve 74 seats within a counterbored portion 77 at the lower end of shaft 29, where it is secured by suitable fastening means (not shown).

The previously-mentioned insulator 40 next is slipped over the upper end of coolant return tube 72 and into the upper end of tubular shaft 29 until the shaft seats against a step 77a. The insulator is then attached to the top of the shaft by a clip 78 and screws 79 or other suitable means. The bias electrode is thereby securely attached via the coolant return tube and insulators 40 and 74 to the tubular shaft 29.

The assembly is completed by inserting a coolant supply tube 80, on the upper end of which is fixed previously described coupling 39, through coolant return tube 72 until a sealing bushing 81, fastened inside the cupped lower end of the coupling by screws 82, fits over the upper end of coolant return tube 72 and seats against insulator 40. The coupling 39 is then secured to insulator 40 by screws 83 or other suitable fasteners.

The length of supply tube 80 is selected so that its lower end is slightly spaced from the bottom of the well hole 45 when the assembly is completed. This allows coolant liquid introduced through inlet 84 in the coupling to flow down through tube 80, out at the bottom of the well hole, and then upward through the annular space between the outer surface of tube 80 and the bore of the well hole and the interior surface of return tube 72. The fluid then leaves the upper end of tube 72 and flows out through an outlet passage 85 in the coupling 39. The coupling 39 and coolant return tube 72 also serve as means for delivering bias power to the electrode 28.

The operation of the above-described magnetically enhanced bias substrate support electrode to perform the method of the present invention will now be explained with reference to FIGS. 1 and 3. After substrates to be coated have been loaded onto the bias electrode 28, the vacuum pump 16 is turned on to evacuate the sputtering chamber 11. When a desired vacuum level has been maintained for long enough to sufficiently outgas the components in the chamber, an inert gas, a reactant gas, or a mixture of inert gas and reactant gas, depending on the type of coating to be applied, is introduced into the chamber through valves 19 and 20 until the desired operating pressure is reached; this is typically in the range of 0.1 to 50 millitorr. Sputtering power is next applied to sputtering source 23, while a shutter 86, mounted on a rod 87 which is vertically slidable in a vacuum-tight bushing 88, is in the raised position in front of the sputtering source. This allows the material sputtered from the source to be deposited initially on the shutter, until the sputtering target surface is clean and ready to deposit uncontaminated material onto the substrates. At an appropriate time, rf power is applied to the substrate support electrode 28 to similarly sputter-clean the substrates.

The procedure described up to this point is conventional and well understood in the art (see, for example, the discussions in Part II-1 of "Thin Film Processes," edited by J. L. Vossen and W. Kern, Academic Press, Inc., 1978, and in Chapter 7 of "Gas Discharge Processes" by B. M. Chapman, J. Wiley & Sons, 1980).

The drive motor 31 is also turned on when rf power is applied to the substrate support electrode, causing the electrode to rotate slowly, and when the sputter-cleaning procedure is complete, the shutter is lowered to permit the sputtered material to be deposited on the substrates s. After the desired coating thickness has been reached on each substrate, the shutter is raised, the power is turned off, and the drive motor is stopped.

Figure 3:
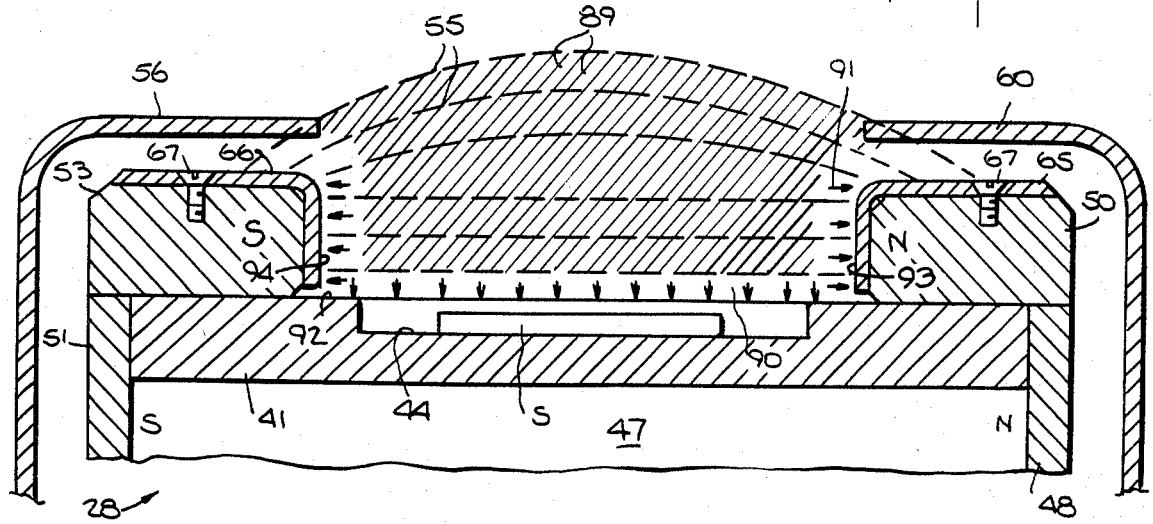
FIG. 3 is an enlarged partial view of the glow discharge region of the substrate support structure of FIG. 2.

The advantage of using the completely enclosed magnetic electron trap for the substrate support electrode of the present invention can be best understood from FIG. 3, which is an enlarged detail view of the region adjacent to one of the substrates s mounted on the support electrode 28.

The application of rf power to this electrode results in the formation of a dense gas discharge or plasma which is localized in the region of the magnetic belt which extends around the periphery of the electrode and is shown in cross-section in FIG. 3 by the dashed lines 55. The glow discharge itself occurs within the region contained within the diagonal dash-dot lines 89. A similar confined discharge forms if a negative dc potential is applied to the electrode. Magnetic pole pieces 50 and 53 are exposed to the plasma in the regions near the magnetic gap. For this reason, they are covered by pole piece lids 65 and 66, respectively, which are made of a material which is inert to the reactive species present in the plasma, if a reactant gas is being used in the coating process.

It should be noted that the plasma region extends towards, but does not reach and touch, those surfaces which are maintained at electrode potential. The space 90 where no plasma exists is known as the plasma sheath region. It is well known that when an electrode is capacitively coupled to an rf power supply, the rectification properties of the plasma cause a dc bias to develop between the electrode surface and the plasma. (See for example Chapter 5 of "Gas Discharge Process" by B. N. Chapman). The bias is such that the plasma is positive with respect to the electrode, except for a very short time period during each rf cycle. This dc bias creates an electric field in the plasma sheath region which is everywhere perpendicular to the electrode surface. The electric field lines are indicated by arrows 91 in FIG. 3. The plasma itself is substantially free of electric fields.

The mechanism of ion formation in the plasma (and reactant radial formation when a reactant gas is used) starts with the emission of electrons from the negatively biased electrode surface. These so-called primary electrons are accelerated towards the plasma by the electric field in the plasma sheath 90, gaining sufficient energy to cause ionization and reactive species formation upon collision with neutral gas atoms. In the absence of the magnetic field, a large fraction of the primary electrons continue to move away from the electrode surface, thereby extending the glow discharge to regions which are far removed from the electrode surface. In addition, many do not collide with a gas atom before they reach an anode surface, so that the degree of ionization and reactive species generation is limited.

The enclosed magnetic field of FIG. 3 alters the electron trajectories, dramatically improving this situation. Consider, for example, those electrons which are emitted from the electrode face 92 and from the exposed surface of the substrate s. Here the sheath electric field lines 91 are perpendicular to the magnetic field lines 55. As a result, the $E \times B$ electron drift motion is directed out of the plane of FIG. 3, causing the electrons to circulate around the periphery of the prismatic electrode, remaining at all times in the magnetic belt, very close to substrates s, whereby ionization or reactive species generation induced by these electrons is confined to a plasma region close to the electrode surface.

The electrons emitted from the pole piece surfaces 93 and 94 (FIG. 3) are confined in a different way. Here, the sheath electric field lines are parallel to the magnetic field lines, so the electrons, after acceleration into the plasma region, continue to move in a spiralling manner parallel to the magnetic field lines. This motion carries the electrons to the opposite surface; i.e., electrons emitted by surface 93 move towards surface 94 and vice versa. However, upon approaching the opposite sheath field, the electrons are repelled back into the plasma, therefore oscillating to and fro, and are consequently also trapped close to the substrate surface.

Thus, all the electrons are trapped by the combined action of the closed loop $E \times B$ drift and the oscillating to and fro motion. Electrons can escape from this trap only slowly, when collisions with gas atoms cause them to cross magnetic field lines until they finally move to electrically grounded dark space shield 60 or to floating dark space shield 56, whereupon they are removed from the discharge. The radial spacing between the electrode face 92 and the plane defined by shields 56 and 60 therefore largely determines the thickness of the plasma belt which, as can be seen from FIG. 3, is very close to the substrate surface.

The positive ion trajectories are determined by the same plasma sheath electric field, but the positive ions are virtually unaffected by the magnetic fields used in this device (typically 50 to 1000 Gauss) because their mass is so much greater than that of the electrons. The sheath field here causes some of the positive ions to be accelerated toward the electrode surfaces 92, 93 and 94 and, more importantly, toward the substrate surface, thereby causing some unwanted sputtering from the electrode and back sputtering from the substrate. The shape of the bias electrode magnetic field of the present invention provides two additional advantages which ameliorate any back sputtering and at the same time improve the results when performing reactive sputter coating.

Firstly, the magnetic field extending parallel and closely adjacent to the electrode face substantially reduces the electric field of the plasma sheath region. Since this field defines the momentum gain of the ions or reactive species which are accelerated towards the exposed surface of the substrate, a reduction in electric field results in an equivalent reduction in ion momentum and energy transferred upon striking the substrate surface. Lower average ion energies at impact result, of course, in less back sputtering.

The lower ion energy at impact also results in less substrate heating, without reducing the reaction rate between reactive species and atoms of material from the sputtering source deposited on the substrate surface. This reaction rate does not increase significantly if the energy of the reactive species particles striking the substrate is increased above a relatively low level.

Secondly, the efficient trapping of electrons by the combined electrode surface magnetic field configuration produces a dense closely-confined plasma, which in turn creates a high level of reactive ions (when performing reactive sputter coating) in a region very close to the substrate surface, thereby increasing the reaction rate for a given power input.

The beneficial effects of the present invention are not limited to the substrate support electrode embodiment shown in FIGS. 1 and 2. In fact, almost any electrode configuration which incorporates a magnetic field and in which the magnetic lines of force emerge from and re-enter the electrode surface and pass closely adjacent to the exposed substrate surface will satisfy the required electron confinement conditions.

Figure 4:
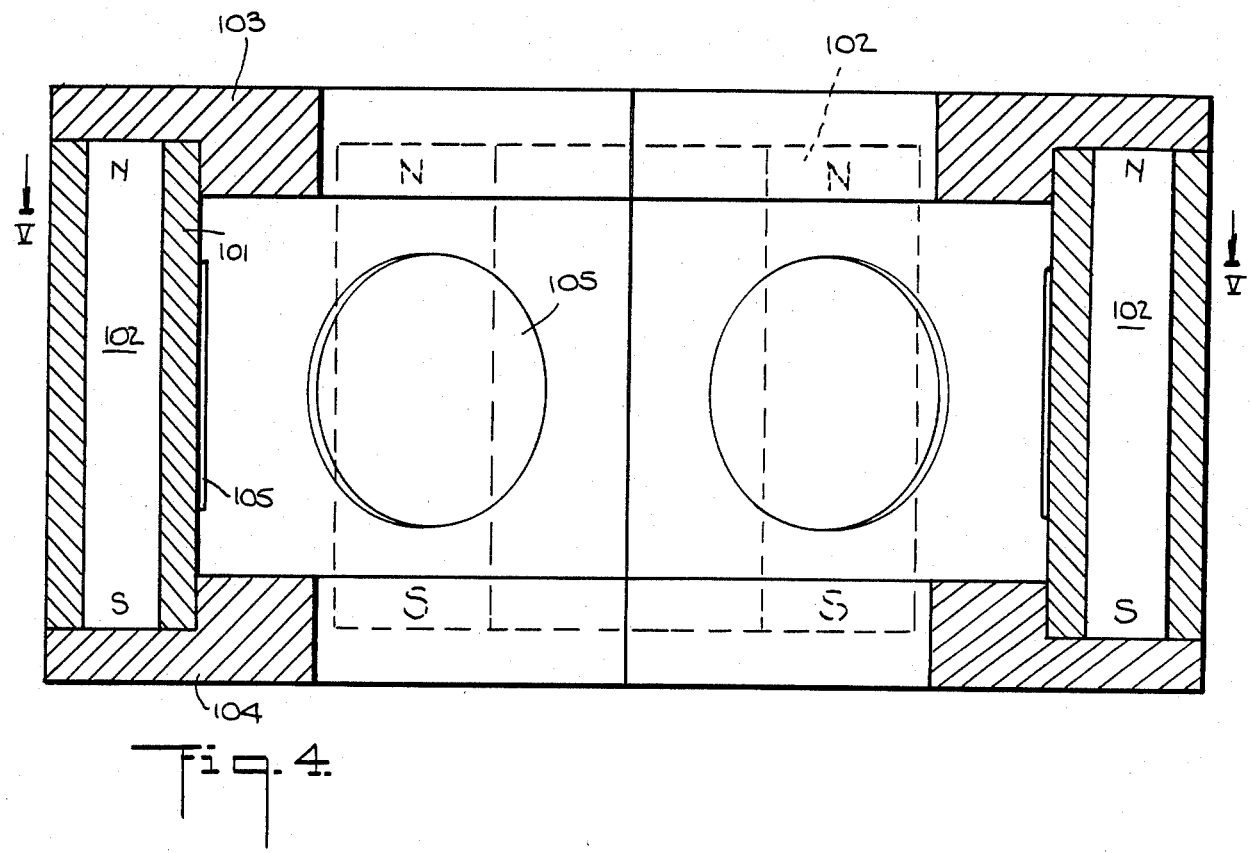
FIG. 4 is an elevation view in cross section of an alternative embodiment of a substrate support structure according to the invention.
Figure 5:
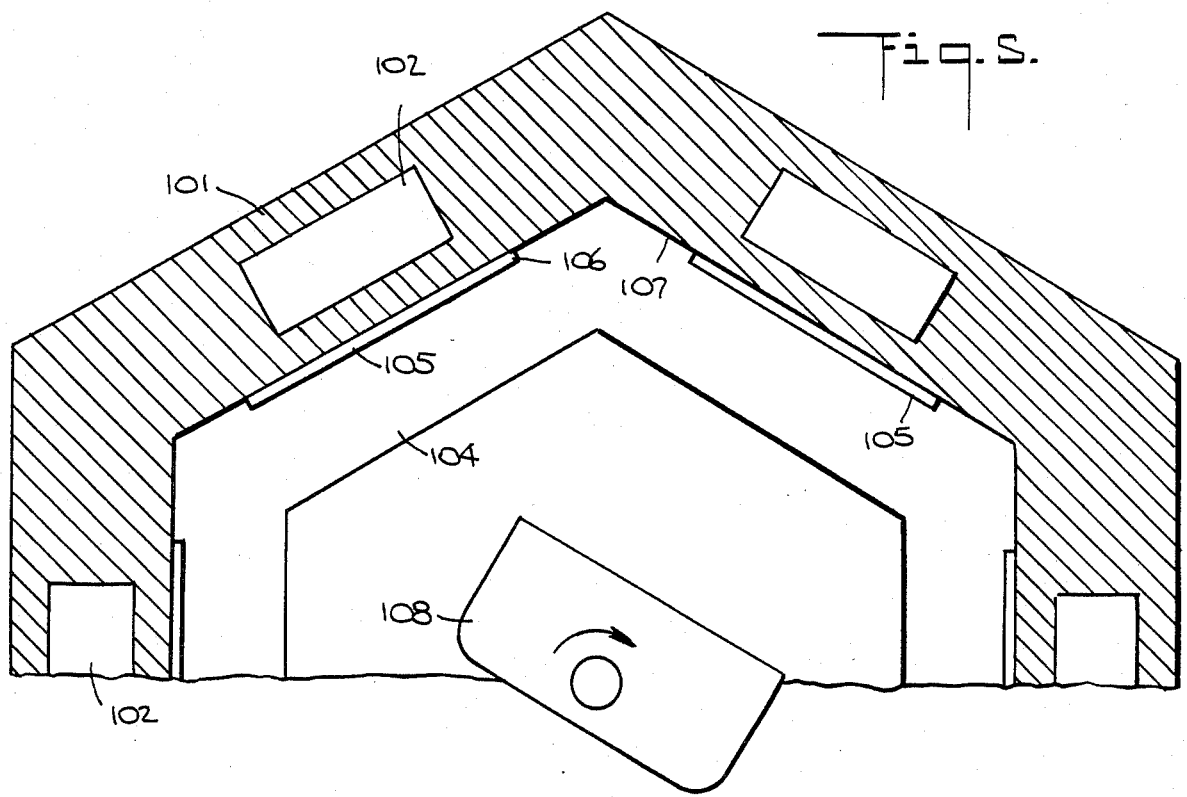
FIG. 5 is a plan view of one half of the substrate support structure taken along line V—V, of FIG. 4, the other half of the structure being symmetrical with that illustrated in the drawing.

FIGS. 4 and 5, for example, show in schematic form an inverted arrangement of the substrate support electrode of FIGS. 1 and 2, in which a closed magnetic curtain extends around the continuous internal surface of a toroidal electrode 101. The electrode has permanent bar magnets 102 mounted in holes in the electrode body. The magnets contact pole pieces 103 and 104 to form a closed loop magnetic field around the interior portion of the toroidal electrode, with the magnetic field lines extending substantially parallel and closely adjacent to the exposed surfaces 105 of substrates 106 mounted on electrode surface 107. The substrates are therefore exposed to the same type of dense gas discharge generated with the electrode embodiment of FIG. 2 under the previously described operating conditions. Not shown are dark-space shields, pole piece lids, and means for applying rf power to the electrode and hermetic chamber, all of which can be similar to those of the previously described embodiment.

As a coating source, a sputtering source 108 may be mounted for rotation about the axis of the toroidal electrode in a manner similar to the mounting of the substrate support electrode of FIG. 2. Alternatively, a stationary cylindrical sputtering target may be installed in the center of the electrode.

Another alternative coating source, usable with any of the possible embodiments of the substrate support of this invention, is a conventional vapor deposition source, as is used in the coating technique known as ion plating.

EXAMPLE

To illustrate the advantages resulting from the present invention, a substrate support electrode having a construction as in the embodiment of FIG. 2 was installed in a sputtering system similar to that of FIG. 1 and used for coating ceramic wafers with aluminum oxide films by reactive sputtering from an aluminum target. After initial evacuation of the chamber, a mixture of argon and oxygen was introduced, with the amount of oxygen being limited by the requirement that the aluminum sputtering target remain free of oxide formation. Specifically, the argon partial pressure was maintained at approximately 15 millitorr and the oxygen partial pressure at approximately 3 millitorr.

Initially, the equipment was operated with 5 kw of sputtering power applied to the aluminum target (i.e., the sputtering source) but not to the substrate support electrode. At these powers and working pressures, aluminum metal sputtering rates were maintained that were higher by about a factor of 10 compared with the rates achievable at the same gas pressures in processes where avoidance of cathode oxidation is not a precondition. The low oxygen pressure also prevented the achievement of a fully oxidized coating on the substrate, as was clearly evident from the black non-transparent appearance of the film deposited on the substrates.

Next, rf voltage was applied to the substrate electrode sufficient to create a glow discharge in the region immediately adjacent to the substrates, as previously described in connection with FIG. 3. This caused the deposited films to change from the opaque black to a clear transparent appearance indicative of a fully oxidized aluminum oxide coating. This condition was achieved at an rf bias power level to the substrate electrode of 300 watts.

A second test was then run under the same conditions except that the bar magnets were removed from the substrate support electrode assembly, thereby eliminating the magnetic field enhancement. With this change in the test conditions, an rf power level of 1500 watts to the substrate electrode was required to achieve transparent coatings, but the films had a frosted appearance. Subsequent examination under a microscope revealed a high degree of surface pitting, which was attributed to resputtering of the deposited film.

We claim:

1. A method of reactive film deposition which includes the steps of providing a metallic coating source and at least one substrate on a substrate support in a hermetic chamber so that a surface of the substrate is exposed to the coating source, evacuating the chamber, introducing at least a reactant gas into the chamber, activating said coating source to emit metallic particles for deposition on said exposed substrate surface, and applying a bias voltage to the substrate support sufficient to ionize the reactant gas for reacting with the metallic particles from said metallic coating source deposited on the substrate, wherein the improvement comprises:

providing a magnetic field having lines of force which leave the substrate support, extend across the surface of the substrate exposed to the coating source, and re-enter the support to enclose said exposed substrate surface in a magnetic electron-trapping field, the strength of said magnetic field decreasing with distance from said exposed substrate surface, and adjusting the bias voltage to be sufficient to produce a dense localized glow discharge containing reactive gas ions and being disposed closely adjacent to said substrate, such that the reaction rate of said gas with the metallic particles deposited on the substrate is increased without a corresponding increase in back sputtering from the substrate.

2. The method of claim 1 wherein said magnetic lines of force extend approximately parallel to the exposed surface of the at least one substrate.

3. The method of claim 1 wherein the step of providing at least one substrate on a substrate support comprises providing a plurality of substrates in spaced relation on a closed surface.

4. The method of claim 3 wherein the closed surface is a prismatic surface.

5. The method of claim 3 wherein the substrates are located around the periphery of the closed surface.

6. The method of claim 3 comprising depositing particles from the coating source upon each substrate sequentially while continuously maintaining a dense glow discharge closely adjacent to the exposed surfaces of all the substrates.

7. The method of claim 1 wherein the step of applying a bias voltage to the substrate support comprises applying a capacitively coupled rf voltage to the substrate support.

8. The method of claim 1 wherein the step of applying a bias voltage to the substrate support comprises supplying a dc voltage to the substrate support.

9. The method of claim 1 wherein the strength of said magnetic field is between about 50 and about 1000 Gauss.

10. The method of claim 1 wherein said coating source is a sputtering target.

11. The method of claim 1 wherein the step of introducing at least a reactant gas into the chamber comprises introducing a mixture of an inert gas and a reactant gas at a total pressure of about 0.1 to about 50 millitorr.

12. An apparatus for reactive film deposition including an evacuable chamber, means for evacuating the chamber, means for introducing a reactant gas at low pressure into the chamber, a coating source located in the chamber, a bias electrode in the chamber having at least one substrate support surface electrically insulated from the chamber and exposed to the coating source for supporting a substrate to be coated, means for activating the coating source to emit particles of a coating material, and means for applying a bias voltage to the substrate support surface sufficient to ionize the reactant gas for reacting with the particles of coating material from said coating source that are deposited on a substrate supported thereby, wherein the improvement comprises:

said bias electrode having magnet means disposed behind the exposed substrate support surface and including first and second spaced apart magnetic pole means of opposite polarity for providing a magnetic field having lines of force which leave said bias electrode, extend across the substrate support surface between said support surface and the coating means, and re-enter said bias electrode to completely enclose said substrate support surface in a localized magnetic electron-trapping field, the strength of said field decreasing with distance away from the substrate support surface.

13. An apparatus for reactive film deposition according to claim 12 wherein said substrate supporting surface comprises at least part of a peripheral surface of the bias electrode, said magnet means is disposed internally of said peripheral surface with each of said first and second spaced apart magnetic pole means of opposite polarity projecting outwardly from and extending completely around said peripheral surface, and said substrate support surface being located between the first and second magnetic pole means.

14. An apparatus for reactive film deposition according to claim 12 wherein said bias electrode comprises a prismatic body having a plurality of flat faces surrounding an axis of symmetry, said faces comprising at least one substrate support surface, and means for supporting the prismatic body for rotation about its axis of symmetry, said magnet means is disposed internally of said prismatic body with each of the first and second spaced apart magnetic pole means of opposite polarity projecting outwardly from the faces of and extending completely around the prismatic body, and the substrate support surfaces being located between the first and second pole means, whereby the localized magnetic field forms a continuous belt around the body of the bias electrode between the first and second pole means.

15. An apparatus for reactive film deposition according to claim 14 wherein the coating source comprises a stationary sputtering target positioned on a line perpendicular to the axis of symmetry of the bias electrode, and said apparatus further comprises means for rotating the bias electrode so that each substrate support surface can face the sputtering target.

16. An apparatus for reactive film deposition according to claim 15 wherein the means for rotating the bias electrode comprises means for continuously rotating said electrode.

17. An apparatus for reactive film deposition according to claim 15 wherein said means for supporting the bias electrode for rotation about its axis of symmetry comprises inner and outer tubes coaxial with said axis for respectively delivering and returning a flow of coolant fluid to and from the electrode body.

18. An apparatus for reactive film deposition according to claim 12 further comprising dark space shields spaced from the substrate support surface of the electrode adjacent to each of said spaced apart first and second magnetic pole means, said dark space shields serving as electron capture shields for limiting the outward extent of said electron-trapping field.

* * * * *